United States Patent
Ahn et al.

(10) Patent No.: US 6,838,763 B2
(45) Date of Patent: Jan. 4, 2005

(54) WIRELESS COMMUNICATIONS SYSTEM EMPLOYING A CHIP CARRIER

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/383,654

(22) Filed: Mar. 10, 2003

(65) Prior Publication Data

US 2003/0148613 A1 Aug. 7, 2003

Related U.S. Application Data

(63) Continuation of application No. 09/384,193, filed on Aug. 27, 1999, now Pat. No. 6,534,855, which is a continuation-in-part of application No. 08/917,443, filed on Aug. 22, 1997, now Pat. No. 6,187,677, and a continuation-in-part of application No. 08/917,449, filed on Aug. 22, 1997, now Pat. No. 6,143,616.

(51) Int. Cl.[7] .............................................. H01L 23/04
(52) U.S. Cl. ....................... 257/698; 257/723; 257/700
(58) Field of Search ................................ 257/698, 723, 257/700, 712, 710

(56) References Cited

U.S. PATENT DOCUMENTS

| | | | |
|---|---|---|---|
| 5,258,648 A | * 11/1993 | Lin | ............. 257/778 |
| 5,399,898 A | 3/1995 | Rostoker | |
| 5,682,062 A | 10/1997 | Gaul | |
| 5,770,889 A | 6/1998 | Rostoker et al. | |
| 5,829,128 A | * 11/1998 | Eldridge et al. | ............. 29/855 |
| 5,926,951 A | * 7/1999 | Khandros et al. | ............. 29/843 |
| 6,187,677 B1 | 2/2001 | Ahn | |
| 6,507,076 B2 | * 1/2003 | Inoue | ........................ 257/368 |

OTHER PUBLICATIONS

L. M. Burns, "Applications for GaAs and Silicon ICs in Next Generation Wireless Communication Systems", Technical Digest, 1994, 16th Annual GaAs IC Symposium, p. 155–158, 1994.

N. Yoshikawa et al, "Multi–layer Microwave Integrated Circuit Technology for GaAs Power Amplifier of Personal Communication System", Technical Digest of 1995, International Solid State Circuit Conference, p. 190–191, p. 365, 1995.

Y. Notani et al, "GaAs Multi–chip Power Amplifier Module suing a Multi–layer TAB Tape", Technical Digest, 1994 16th Annual GaAs IC Symposium, p. 145–148, 1994.

F. McGrath et al, "A 1.9 GHz GaAs Chip Set for the Personal Handyphone System", IEEE Transn on Microwave Theory and Techniques, vol. 43, No. 7, p. 1733–1744, 1995.

J. M. Moniz, "Is SiGe The Future of GaAs for RF Applications?", Technical Digest, 1997 19th Annual GaAs IC Symposium, p. 229–231, 1997.

R. M. Rodrigo et al, "AlGaAs/GaAs HEMT 5–12 GHz Integrated System for an Optical Receiver", Proceedings of the 1998 IEEE International Symposium on Circuits and Systems, vol. 2, p. 312–315, 1998.

* cited by examiner

Primary Examiner—Caridad Everhart
(74) Attorney, Agent, or Firm—Dickstein Shapiro Morin & Oshinsky LLP

(57) ABSTRACT

A wireless communication system comprising a carrier having a top and a bottom surface, and a plurality of integrated circuit components for transmitting and receiving communication signals located on the top and bottom surfaces of the carrier. At least one passageway extends through the carrier, and conductive material extends through the passageway for electrically interconnecting the integrated circuit components located on the top and bottom surfaces of the carrier.

23 Claims, 13 Drawing Sheets

WIRELESS COMMUNICATIONS SYSTEM EMPLOYING A CHIP CARRIER

CROSS-REFERENCE TO RELATED APPLICATIONS

This application is a continuation of U.S. patent application Ser. No. 09/384,193, filed Aug. 27, 1999, now U.S. Pat. No. 6,534,855 which is a continuation-in-part of U.S. patent application Ser. No. 08/917,443, filed Aug. 22, 1997, now U.S. Pat. No. 6,187,677 and, is a continuation-in-part of U.S. patent application 08/917,449, filed Aug. 22, 1997 now U.S. Pat. No. 6,143,616. Each of these is incorporated herein by reference.

BACKGROUND OF THE INVENTION

1. Field of the Invention

This invention relates to a wireless communication system and to a method of making the system. More particularly, the invention relates to a wireless communication system, such as for portable telephones, on a chip.

2. Discussion of the Related Art

Emerging applications for portable wireless voice and data communications (wireless internet) systems require increased data rates and functionality. Meeting cost and performance goals requires careful attention to system level design and partitioning such that appropriate technologies are employed in cost-effective implementations. It is believed that optimum implementations will employ a mixture of GaAs and silicon integrated circuits as well as high-performance miniaturized passive components.

As the existing RF spectrum becomes more and more crowded, new radio frequency integrated circuit (RFIC) capabilities will be required to implement power and spectrally efficient digital modulation and demodulation schemes needed by new wireless systems.

Typical radio architectures and transceiver sub-circuits which have been integrated are described by L. M. Burns, "Applications for GaAs and Silicon ICs in Next Generation Wireless Communication-Systems," Technical Digest, 16th Annual GaAs IC Symposium, p. 155–158, 1994, which publication is incorporated herein by reference.

A circuit from the Burns et al publication is provided in FIG. 1. With reference to FIG. 1, there is shown Plessey's Frequency Hopping Spread Spectrum transceiver, which operates in the 2.4 GHz GSM band, and which is a good example of a wireless system for use with the present invention. The system has a base double conversion super heterodyne architecture with only two master oscillators which enables fast switching between transmit and receive modes. GaAs is used in the IC 20 containing the low noise amplifier (LNA), up and down converting mixers, switches for transmit/receive (T/R) and antenna switching 22 and one of the voltage controlled oscillators (VCO's) 23. The second IC 30 contains the downconverting mixer, intermediate frequency (IF) limiting amplifier, received signal strength indicator (RSSI) and frequency discriminator. This IC 30 is fabricated using a high speed silicon bipolar process.

A third IC 40, fabricated using the same high speed silicon bipolar process, contains high frequency prescalers, dividers and the second VCO. Three phase locked loops (PLLs) 50, 52, 54 fabricated in 1 $\mu$m CMOS are used to set the frequencies of the two master oscillators. A variety of miniature, high performance passive filters are also used. A high-Q ceramic resonator filter is used to band limit the transmit/receive (TX/RX) signals. Surface acoustic wave (SAW) filters are used in the first and second IF strips to provide needed selectivity while maintaining good group delay characteristics. A simple gaussian LC lowpass filter is used to pulse shape the transmitted signal to implement GFSK modulation.

Another RF transmission/reception circuit from the Burns et al. publication which has been integrated is shown in FIG. 2. With reference to FIG. 2, the wireless system shown is the National Semiconductor DECT transceiver. This transceiver contains many of the same functional building blocks as the Plessey example in FIG. 1. The transceiver operates in the 1.88–1.90 GHz band. Almost all of the ICs in this design are fabricated in National's silicon BiCMOS IC process. The most notable exception is the GaAs power amplifier. Although the silicon downconverter/mixer has a relatively high aggregate noise figure of 8.7 dB, this is adequate to meet DECT specifications. A single conversion, superheterodyne receiver is used. The DECT transceiver also uses gaussian filtering on the transmitted data stream. However, the National transceiver filters the bit stream with an on-chip gaussian lowpass filter based on a ROM look-up table.

Optical transceiver applications have also been integrated. See, for example, Rodrigo et al, "AlGaAs/GaAs HEMT 5–12 GHz Integrated System for an Optical Receiver," Proceedings of the 1998 IEEE International Symposium on Circuits and Systems, vol. 2, p. 312–315, 1998, which publication is incorporated herein by reference. A system from Rodrigo et al is illustrated in FIG. 3. The circuit includes an input network 80 to emulate the photodiode function, a pre-amplifier 82, an automatic gain control (AGC) unit 84, two gain stages 86, the comparator 87 and the output buffer 88.

Microwave transmission and reception circuits have also been integrated. There are two basic types of integrated circuit structures for microwave transmission/reception systems: monolithic microwave integrated circuits (MMIC) and microwave integrated circuits (MIC). However, these structures have basic problems. The MMIC die is large because needed microwave matching and filter circuits occupy a large area which results in high cost. The MIC die is also large because conventional MIC's consist of single-layer circuits. In response to these problems, a multilayer microwave integrated circuit (MuMIC) was introduced by Matsushita Electronics as described by N. Yoshikawa et al in "Multilayer Microwave Integrated circuit Technology for GaAs Power Amplifier of Personal Communication System," Technical Digest of 1995 International Solid State Circuit Conference, p. 190–191, 365, 1995, which publication is incorporated herein by reference. The MuMIC uses a multilayer substrate formed of low temperature co-fired ceramics.

To reduce the size and weight of mobile telephones, tape automated bonding (TAB) has been used in a multilayer integrated circuit configuration to assemble a 900 MHz-band GaAs multichip power amplifier module for a Mitsubishi Electric transmitter as described in Y. Notani et al, "GaAs Multi-chip Power Amplifier Module using a Multi-layer TAB Tape," Technical Digest, 1994 16th Annual GaAs IC symposium, p. 145–148, 1994, which publication is incorporated herein by reference.

Another example of a radio frequency integrated circuit (RFIC) is described by McGrath et al in "A 1.9 GHz GaAs Chip Set for the Personal Handyphone System," IEEE Transactions on Microwave Theory and Techniques, vol. 43, no. 7, p. 1733–1744, 1995, which publication is incorporated herein by reference. The McGrath et al publication includes chip, partition, design and performance of each sub-function relative to requirements imposed by an air interface.

Although the articles discussed above illustrate attempts at integrating many of the components of a wireless communication system using several ICs and passive components, they still require numerous integrated circuits and/or large die areas. Accordingly, further integration and size reduction is required, particularly for wireless communications devices, such as cellular telephones.

SUMMARY OF THE INVENTION

The present invention provides structure for enhanced compactness and miniaturization which permits further integration and simplified interconnection of the components of a wireless communication device, such as those for a portable telephone.

In accordance with the present invention, there is provided a wireless communication device comprising a carrier having a top and a bottom, and a plurality of integrated circuit components located on the top and bottom of the carrier for transmitting, receiving and processing wireless communication signals. At least one passageway extends through the carrier, and conductive material extends through the passageway for electrically interconnecting the integrated circuit components located on the top and bottom of the carrier.

The present invention also provides a method of forming a wireless communication device comprising the steps of providing a carrier having a top and a bottom surface and forming holes through the carrier between the top or bottom surfaces. Integrated circuitry is formed on the top and bottom surfaces of the carrier as mounted chips or circuit elements fabricated within the carrier for transmitting, receiving and processing wireless communication signals. The holes are filled with conductive material to interconnect the integrated circuitry on both sides of the carrier.

The carrier is preferably formed of silicon. Further, the wireless communication signals may represent voice, data and/or images. In one embodiment, the wireless communication system is a portable telephone.

As used herein, the term "carrier" means any substrate structure, whether or not part of a semiconductor wafer, for supporting integrated circuit (IC) components on opposite sides thereof. The substrate may include one or more layers of materials on opposite sides which are fabricated to define the components and electrical circuity of a wireless communications device. The integrated circuitry is formed as chips mountable on the carrier and/or circuit element fabricated within the carrier surfaces. Functionally, the substrate may be capable of having holes formed therethrough, preferably by etching. The holes are provided as passageways for conductive material to interconnect integrated circuit (IC) components on opposite sides of the substrate. As noted, components of the communication device are fabricated directly on the carrier and/or are formed as integrated circuit chips mounted on the carrier.

Suitable compositions for the carrier include silicon, SiGe, GaAs, GaAlAs, SiC and mixtures thereof. As noted above, silicon is preferred.

The cost of SiGe chips are claimed to be lower than that of GaAs chips. See J. M. Moniz, "Is SiGe the Future of GaAs for RF Applications?," Technical Digest, 997 19th Annual GaAs IC Symposium, p. 229–231, 1997, which publication is incorporated herein by reference.

The use of silicon as a carrier has many advantages over the low-temperature co-fired ceramic carrier used in the multilayer microwave integrated circuit (MuMIC) described in the Yoshikawa et al publication, supra. For example, fabrication of many different types of passive components, such as filters, resonators, and matching networks, and interconnection between active chips and other components can be accomplished by ordinary integrated circuit processing techniques directly on silicon carrier. When packaged, there will be no mismatch in thermal expansion coefficients between the active silicon chips and the silicon carrier to which the chips are mounted. Further silicon is readily available. Also, for the instant application, reject silicon substrates from other device fabrication, such as microwave or RF front-end processing, can be used as carriers.

The fabrication of the wireless communication system in this compact structure is enabled by novel holes in the silicon carrier for feedthroughs and also unique coaxial feedthroughs.

In order to simplify and reduce the processing complexity of microwave GaAs chips, circuits which require large area such as matching and filter circuits are fabricated directly on the silicon carrier.

Combining microwave frequency GaAs chips and radio frequency chips fabricates on silicon onto a silicon carrier in accordance with the instant invention provides for a more tightly integrated product offering higher performance and lower cost.

The above and other features and advantages of the invention will be more readily understood from the following detailed description which is provided in conjunction with the accompanying drawings.

DETAILED DESCRIPTION OF THE PREFERRED EMBODIMENTS

Figure 1:
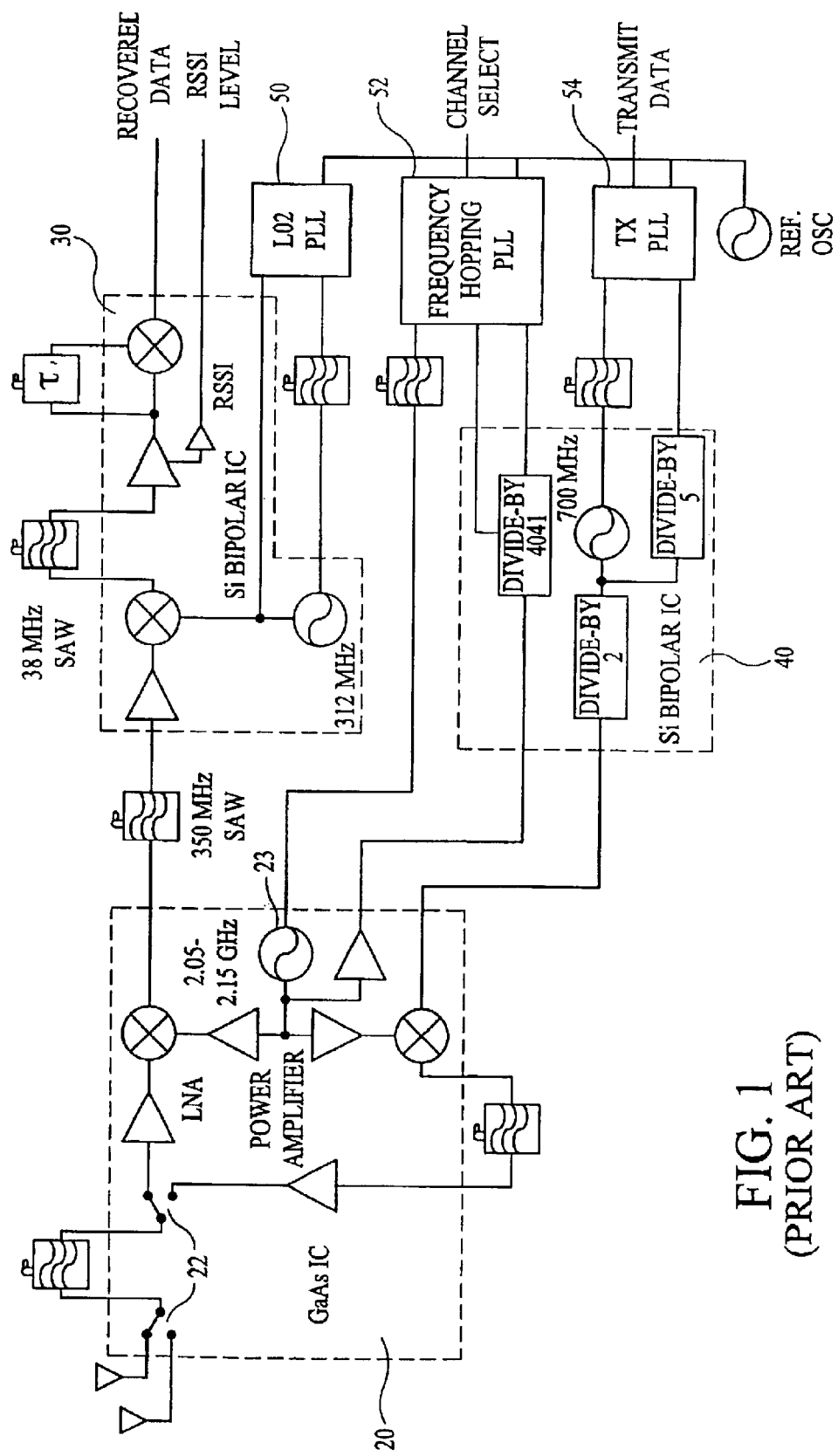
FIG. 1 is a prior art wireless system in the form of a frequency hopping spread spectrum transceiver.
Figure 2:
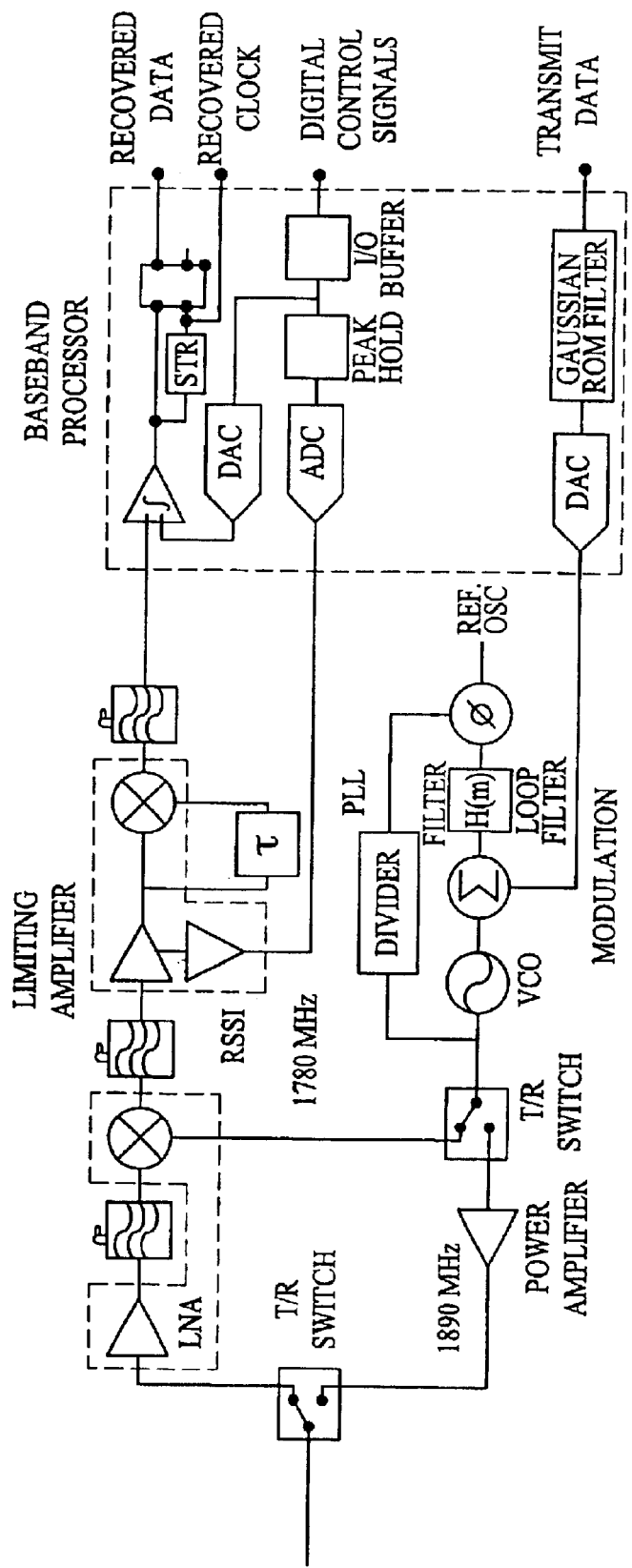
FIG. 2 is another prior art wireless system in the form of the National Semiconductor DECT transceiver.
Figure 3:
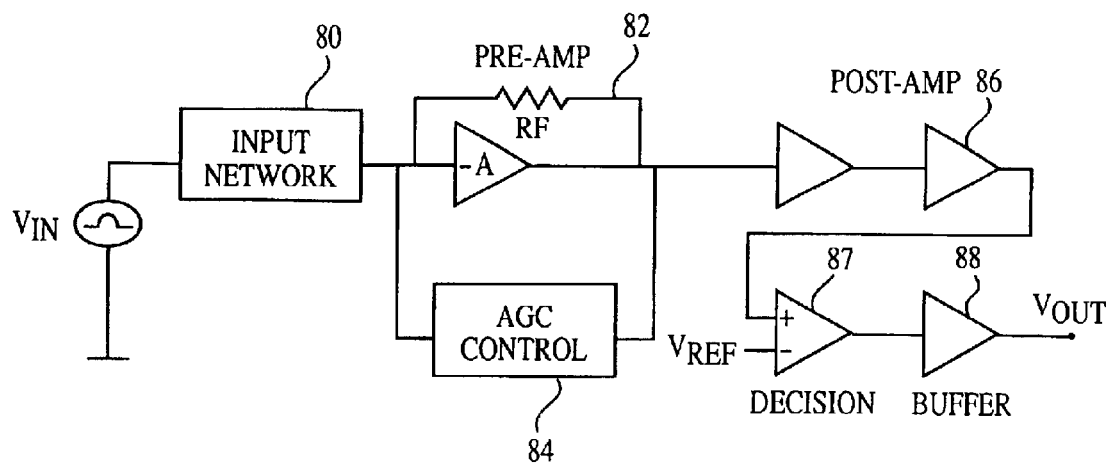
FIG. 3 is a schematic drawing of a prior art system configuration of an optical receiver.

There are many suitable wireless communication systems for use in the instant invention to provide a portable telephone, such as those shown in FIGS. 1 to 3. These systems are schematically represented in the drawings as various integrated circuit components which are miniaturized in accordance with the invention to provide circuitry for a portable telephone. The circuitry can be integrated into one or more chips which can be mounted on a carrier as described below and/or the circuitry or portions thereof can be integrated directly on or into top or bottom surfaces of a carrier.

Figure 4:
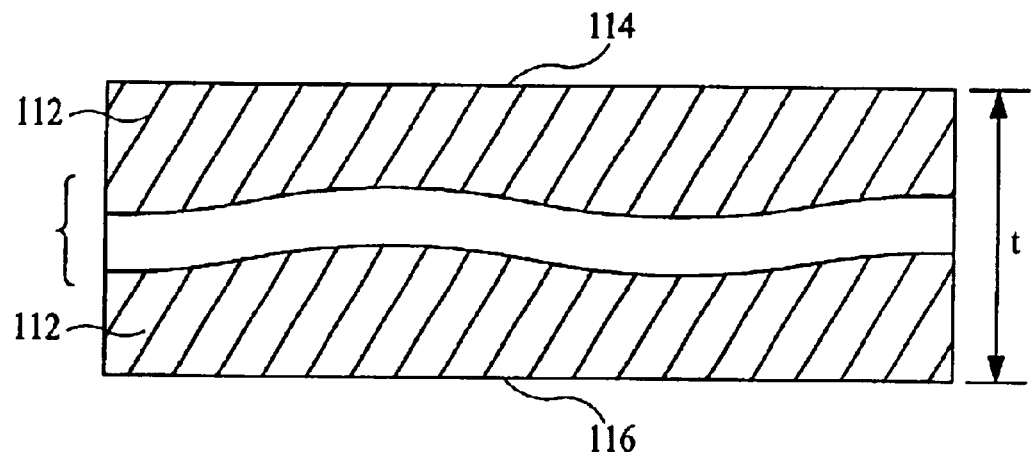
FIG. 4 is a cross-sectional view of a carrier at an initial stage in a process in accordance with the present invention.

With reference to FIG. 4, a carrier 112, which can be formed of silicon, SiGe, GaAs, GaAlAs, or SiC, or mixtures thereof, but which is preferably a silicon carrier, is shown having a top surface 114 and a bottom surface 116 and a thickness t which is defined between the surfaces. A suitable silicon carrier thickness is about 30 mils or between about 750–800 µm.

Figure 5:
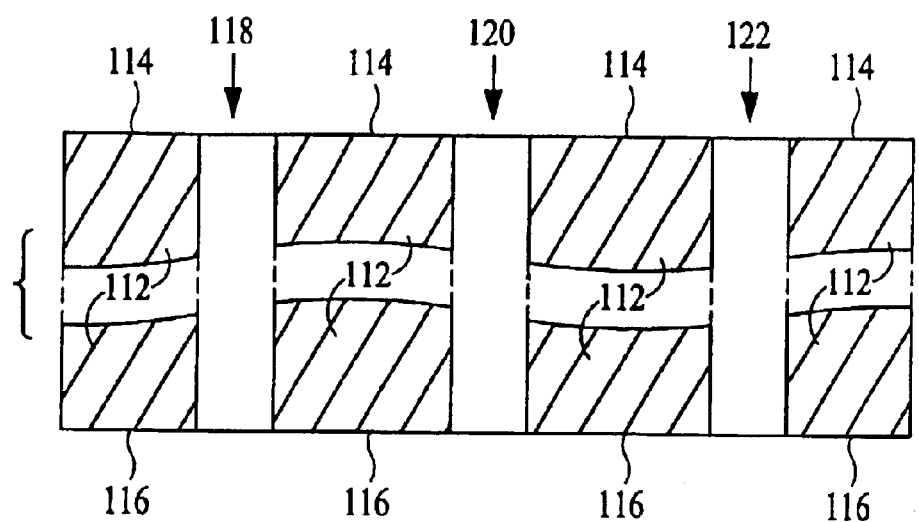
FIG. 5 is the carrier of FIG. 4 with holes or passageways formed therethrough.

Referring to FIG. 5, the silicon carrier is etched to form holes or passageways 118, 120, and 122. Preferably the holes 118, 120, and 122 extend perpendicularly through the entirety of the carrier 112 and extend between the top and bottom surfaces 114, 116. Preferably, holes 118, 120, and 122 have aspect ratios greater than about 50. Even more preferably, such holes have aspect ratios between about 75 and about 80.

In a preferred embodiment, holes 118, 120, and 122 are formed or otherwise provided prior to processing of any integrated circuitry devices on either of surfaces 114, 116. In addition to suitable etching techniques, the holes can be formed or drilled with a suitable laser.

In a preferred aspect, very high aspect ratio holes are formed by placing the carrier in a semiconductor processor having a dipole-ring magnetron etching reactor. Thereafter, the carrier 112 is exposed to conditions within the dipole-ring magnetron etching reactor which are sufficient to form holes which extend through the entirety of the carrier 112. A suitable dipole-ring magnetron (DRM) reactor is described in an article entitled "Trench Storage Node Technology for Gigabit DRAM Generations," Technical Digest of International Electron Devices Meeting, Dec. 8–11, 1996, pps. 507–510, published by IEEE, Catalog No. 96CH35961 by Muller et al. Additionally, a suitable DRM system and exemplary processing conditions are also described in an article entitled "A New High-Density Plasma Etching System Using A Dipole-Ring Magnet," Jpn. J. Appl. Phys., Vol. 34, Pt. 1, No. 11, November 1995, pps. 6274–6278, by Sekine et al. After their formation, the holes 118, 120, and 122 can be temporarily filled with a material such as photoresist to enable subsequent processing of integrated circuitry devices on either or both of surfaces 114, 116.

Figure 6:
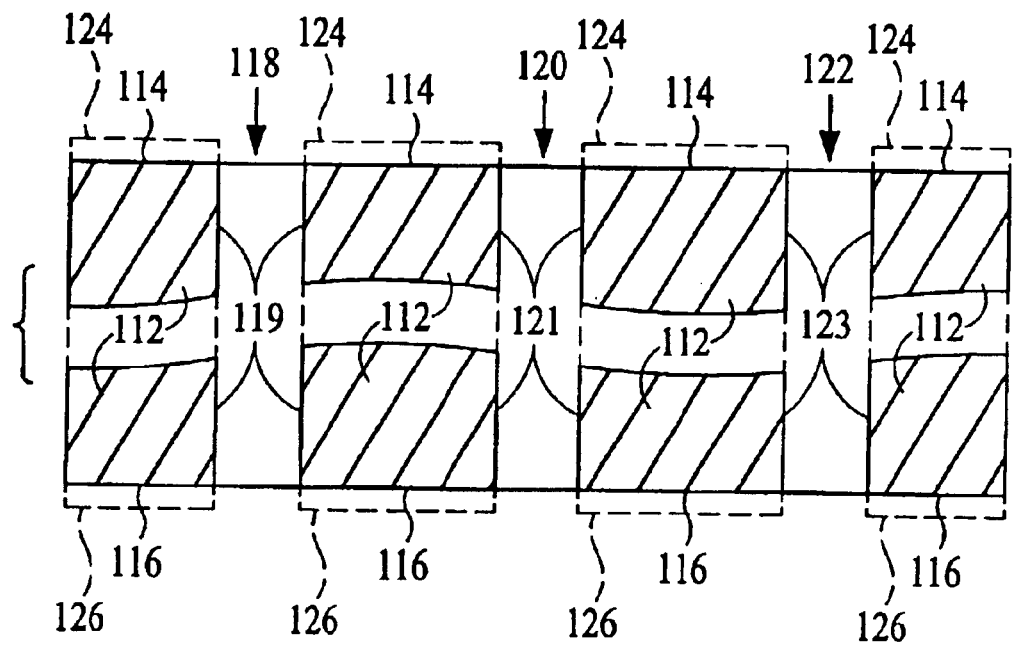
FIG. 6 is the carrier of FIG. 5 with integrated circuitry formed thereon.

Referring to FIG. 6, integrated circuitry 124 of a wireless communication system for, e.g. a portable telephone such as shown in FIGS. 1, 2 or optical system shown in FIG. 3, is fabricated on and supported by the silicon carrier 112. Integrated circuitry 124, 126 can be fabricated on top surface 114 and/or bottom surface 116.

Figure 7:
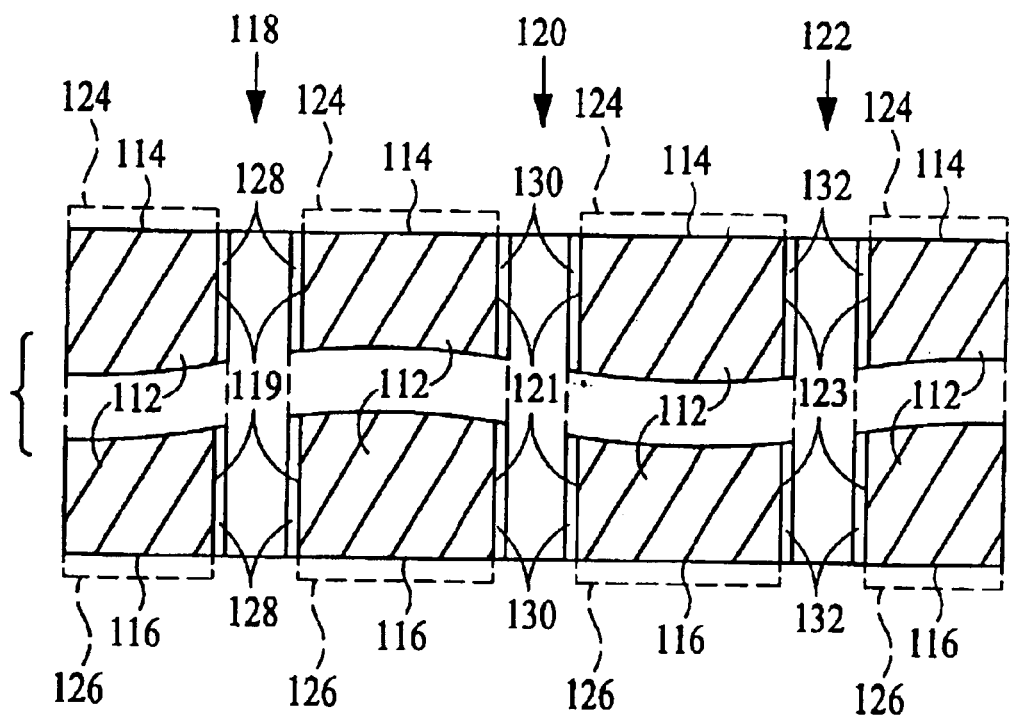
FIG. 7 is the carrier of FIG. 6 with dielectric layers formed in the holes or passageways.

Referring to FIG. 7, after fabrication of circuitry 124, silicon carrier 112 is exposed to conditions which are effective to form dielectric layers 128, 130, and 132 within each of holes 118, 120, and 122 and on respective interior surfaces 119, 121, and 123. In one aspect, dielectric layers 128, 130, and 132 are a nitride-containing layer. An oxide-containing layer is formed over the nitride-containing layer to provide a dielectric NO layer within each hole.

In a preferred embodiment, a nitride-containing layer is formed by chemical vapor deposition, and the oxide layer is formed by exposing the carrier 112 to oxidizing conditions. In a preferred embodiment, dielectric layers 128, 130, and 132 are a reoxidized LPCVD nitride film. One processing embodiment includes in-situ nitridation in ammonia at 950° C. Low pressure chemical vapor deposition of nitride at 700° C. takes place with dichlorosilane and ammonia. Subsequently, reoxidation of the nitride takes place at a temperature of between 900° C. to 950° C. Alternatively, fast thermal processing (FTP) can implement the above-described processing steps into a single processing run. Suitable processing methods and systems are described in the Muller et al. article referenced above. Alternatively, dielectric layers 128, 130, and 132 can comprise a thin silicon dioxide film. A desired and exemplary thickness of such layers is between about 50–100 nanometers.

Figure 8:
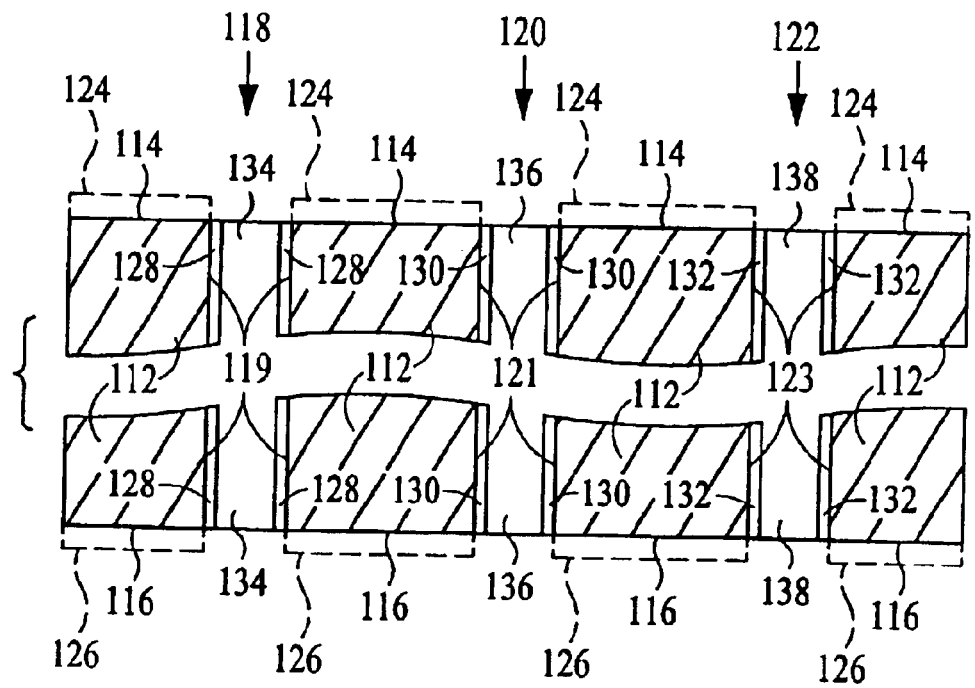
FIG. 8 is the carrier of FIG. 7 with electrical interconnect material formed in the holes or passageways.

Referring to FIG. 8, electrical interconnect material 134, 136 and 138 is next formed within holes 118, 120, and 122. Such material 134 preferably fills each hole and is capable of electrically interconnecting integrated circuitry 124, 126 formed on both top and bottom surfaces 114, 116. In a preferred embodiment, interconnect material 134, 136, and 138 is a first material which is formed within each respective hole and comprises polysilicon which is formed by a chemical vapor deposition process. Excess first material can be removed through conventional techniques to provide the FIG. 8 construction. Such conventional techniques include planarization and/or various etching techniques. Planarization is used in an embodiment after the holes 118, 120, 122 are filled with electrical interconnect material, but before the integrated circuitry 124, 126 is fabricated on the carrier 112.

Figure 9:
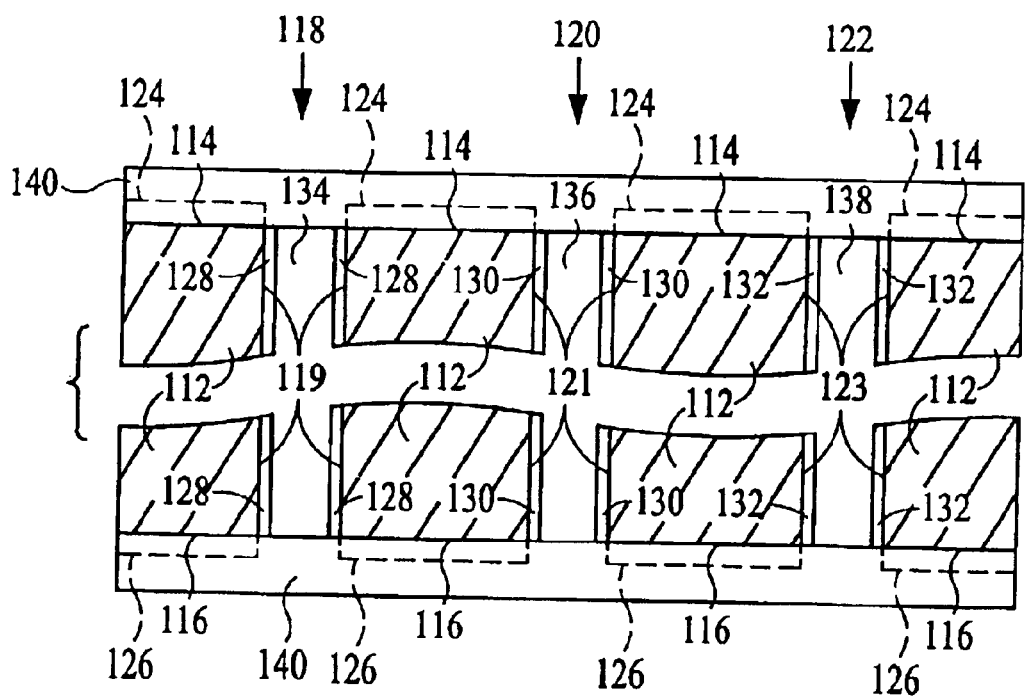
FIG. 9 is the carrier of FIG. 8 with electrically conductive material formed on the top and bottom surfaces of the carrier.

Referring to FIG. 9, a second layer of electrically conductive material 140 is formed over first material 134, 136, and 138, which preferably is polysilicon. Preferably, such material 140 is formed over both top and bottom surfaces 114, 116. In another aspect, second material 140 is a layer comprising a metal material which is different from first material 134, 136, and 138. In a preferred aspect, second material 140 constitutes a layer or film containing aluminum. Such material or film can be deposited through suitable sputtering or evaporation techniques. Mechanical masks can be used to define the area over which the preferred aluminum layer is deposited. Alternatively, such layer can be blanket deposited and subsequently processed as described in the following paragraph.

Figure 10:
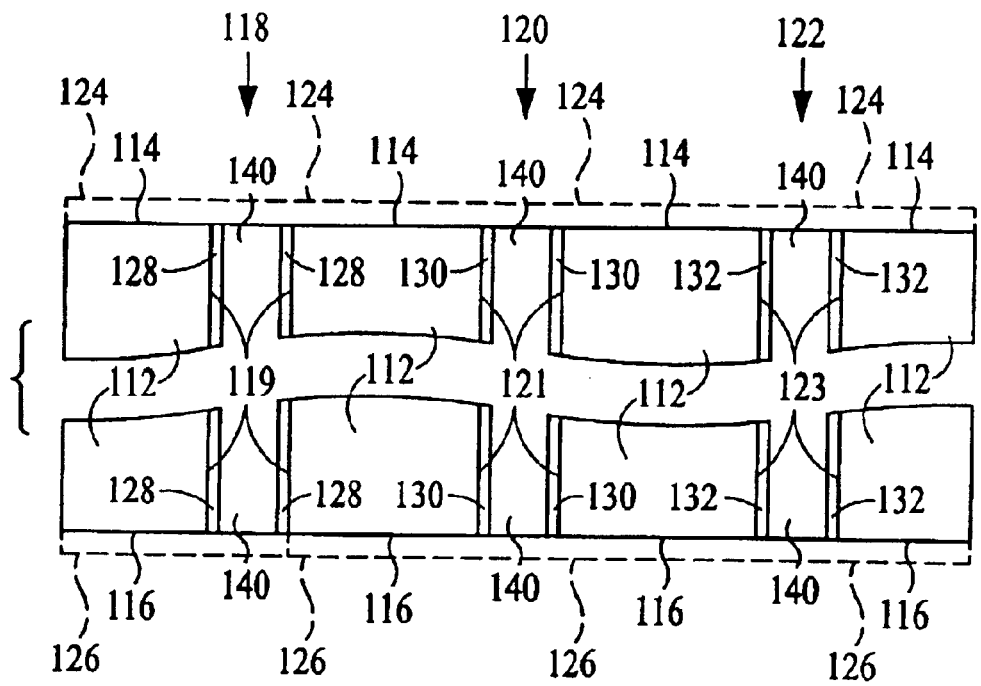
FIG. 10 is the carrier of FIG. 9 with the electrically conductive material replacing the electrical interconnect material introduced in FIG. 8.

Referring to FIG. 10, the silicon carrier 112 is exposed to processing conditions which are effective to cause the second material (preferably aluminum-containing) 140 to replace the first material (preferably polysilicon) 134, 136, and 138 (FIG. 9). Preferably, the first material is completely replaced by the second material 140 in the holes 118, 120, 122, and the second material electrically interconnects at least some of the top surface integrated circuitry 124 with at least some bottom surface integrated circuitry 126. Suitable processing conditions for causing the substitution of the polysilicon-containing material 134, 136, 138 by the aluminum-containing material 140 include annealing the silicon carrier at a temperature equal to or greater than about 500° C. for a sufficient amount of time to complete the annealing step.

The thickness of the second material 140 (FIG. 9) will be determined by the size and dimensions of the interconnecting hole or passageway. Typically for a 0.175 micron diameter and 1.7 micron deep hole with an aspect ratio of 10, an aluminum thickness of 0.5 microns is sufficient to use in place of the polysilicon. Annealing times and temperatures can be decreased by forming a thin, e.g., 0.2 $\mu$m covered Ti layer over the material 140 prior to annealing. The Ti layer acts as a polysilicon capture layer which accelerates the replacement of polysilicon with aluminum. Exemplary processing methods are described in an article entitled "Novel High Aspect Ratio Plug for Logic/DRAM LSIs Using Polysilicon-Aluminum Substitute (PAS)," Technical Digest of International Electron Devices Meeting, Dec. 8–11, 1996, pps. 946–8, published by IEEE, Catalog No. 96CH35961 by Horie et al. Excess aluminum and the substituted polysilicon can be removed through suitable processing techniques such as chemical mechanical polishing.

Thus, in accordance with the invention as described above, holes 118, 120, 122, are formed first, preferably, in a semiconductor substrate 112. Following formation of the holes 118, 120, 122, integrated circuitry 124, 126 is formed on the top 114 and bottom 116 surfaces of the silicon carrier 112. After formation of the integrated circuitry 124, 126, the holes 118, 120, 122 are filled with electrically conductive interconnect material, using one of the techniques described above, which interconnects the integrated circuitry 124, 126 on the top and bottom surfaces 114, 116.

As a variation, integrated circuitry 124, 126 can be formed first, and then the holes 118, 120, 122 are formed using any of the techniques described above for hole formation. Thereafter, such holes 118, 120, 122, are filled with conductive interconnect material in a manner which interconnects the integrated circuitry 124, 126 on the top and bottom surfaces 114, 116.

It is also possible to mount individual integrated surface chips containing portions of the system circuitry directly on the top 114 and bottom 116 surfaces.

Figure 11:
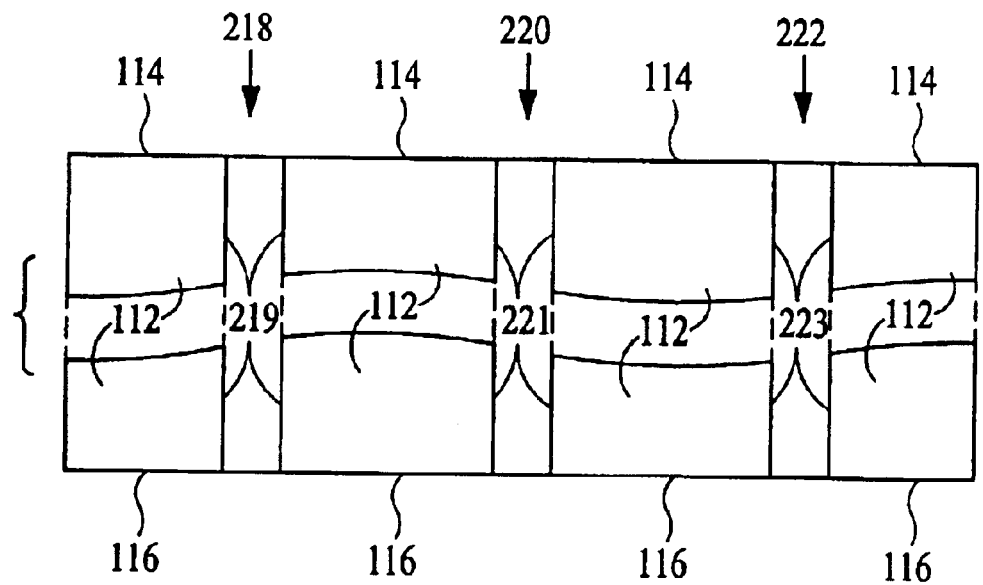
FIG. 11 is another embodiment of the present invention showing a carrier with a plurality of holes or passageways therethrough.

In accordance with another embodiment of the invention, a coaxial structure is formed in one or more of the holes 218, 220, 222 (FIG. 11) to interconnect the integrated circuitry on the top and bottom surfaces 114, 116 of the silicon carrier 112. Referring to FIGS. 4 and 11, a plurality of holes or passageways 218, 220, 222 are formed through the carrier 112 between the top and bottom surfaces 114, 116. Each hole or passageway is defined, at least in part, by a respective interior wall portion 219, 221, 223 which joins with the top and bottom surfaces 114, 116. The holes 218, 220, 222 can be formed by any suitable processing techniques, with one such technique being described below with reference to FIGS. 11 and 12. In one aspect, such holes are formed in this embodiment to have very high aspect ratios (depth-to-width ratios). Preferably aspect ratios are greater than about 100. More preferably, the aspect ratios are greater than about 200.

Figure 12:
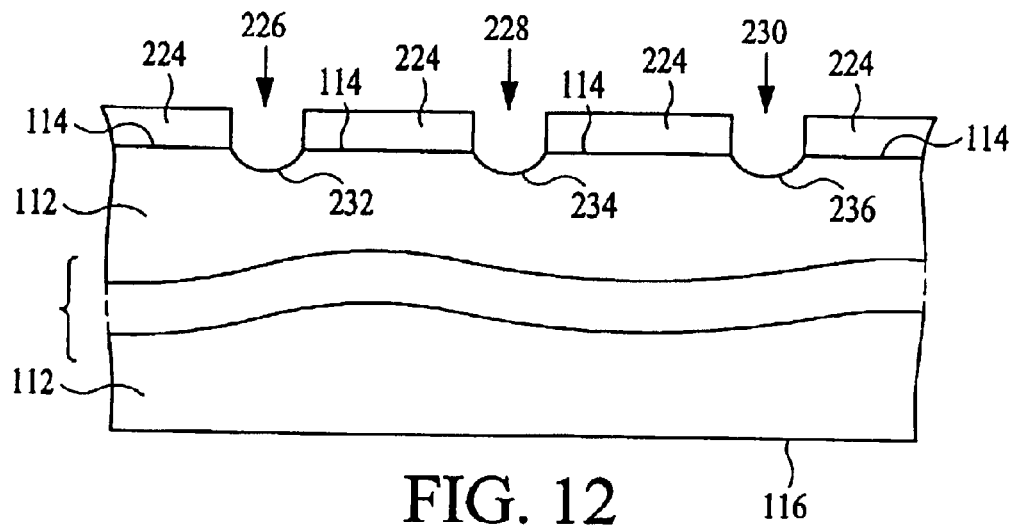
FIG. 12 shows a carrier at a processing step prior to the construction shown in FIG. 11, and with a masking material such as photoresist on the top surface of the carrier.

Referring to FIG. 12, silicon carrier 112, is shown at a processing step which follows the FIG. 4 construction and precedes the FIG. 11 structure. A layer 224 of masking material, such as photoresist, is formed over the top and/or bottom surfaces 114, 116. The masking layer 224 is shown only over the top surface 114, and is patterned to define a plurality of openings 226, 228, 230 over a carrier area in which holes 218, 220, 222 (FIG. 11) are to be etched.

An alkaline etch is conducted to form a pattern of etch pits 232, 234, 236 as defined by the openings 226, 228, 230 in the masking layer 224. The etch pits 232, 234, 236 facilitate the subsequent etching operation which forms openings 226, 228, 230. After the pits 232, 234, 236 are etched, the masking material layer 224 is stripped away.

Figure 13:
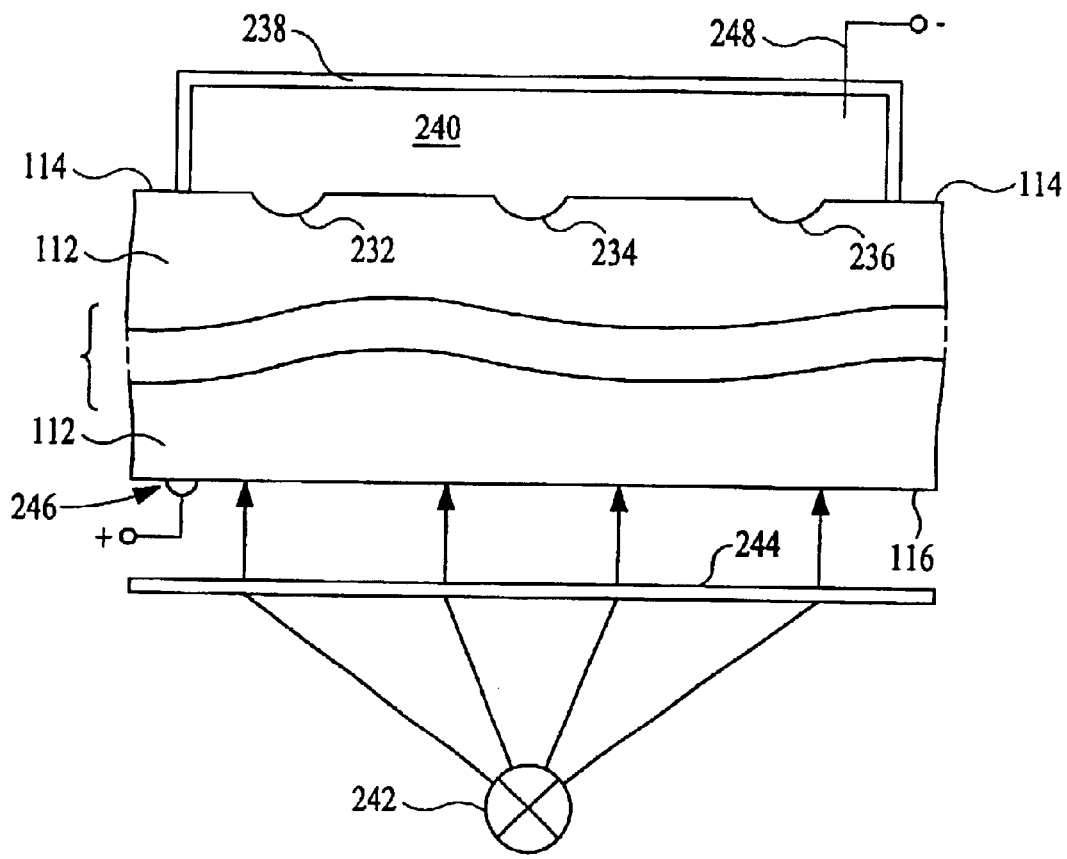
FIG. 13 schematically shows an etching step being performed on the top surface of the carrier.

Referring to FIG. 13, a cover 238 is next provided over top surface 114 and etch pits 232, 234, 236. An HF electrolyte solution 240 is provided over top surface 114 and etch pits 232, 234, 236. Cover 238 serves to isolate top surface 114 and restrict the solution 240 to only the isolated portion of the top surface 114. Preferably, top surface 114 is maintained in the dark. To increase the flow of minority carriers at the top surface 114, the bottom surface 116 is suitably illuminated. More specifically, a lamp 242 and an optical high-pass filter 244 are used to provide a source of illumination which increases the flow of minority carriers at the top surface 114. An ohmic contact 246 can be provided relative to surface 116 and a platinum wire 248 can be provided in solution 240 to develop a suitable bias to etch the holes 218, 220, 222 (FIG. 11).

The above-described processing technique is discussed in more detail in an article entitled "The Physics of Macropore Formation in Low Doped N-Type Silicon," by Lehmann, J. Electrochem. Soc., volume 140, No. 10, October 1993. However, it will be understood that holes 218, 220, 222 can be formed by other conventional techniques.

Figure 14:
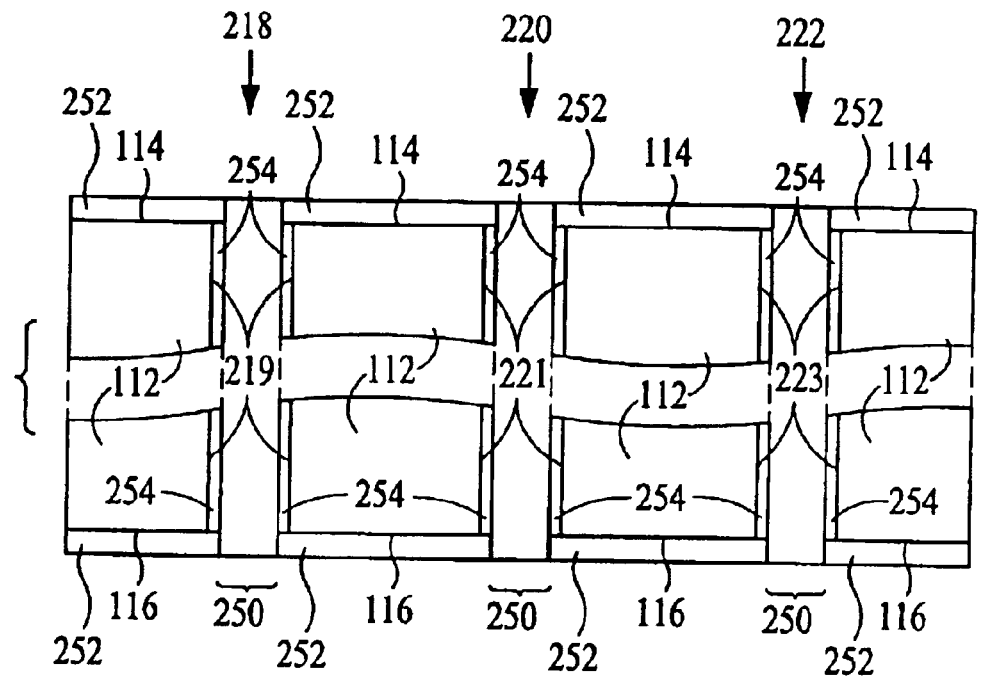
FIG. 14 shows the carrier of FIG. 11 with conductive sheaths formed in the holes or passageways of the carrier.

Referring to FIG. 14, outer conductive sheaths 250 are formed relative to and within each hole 218, 220, 222. The sheaths 250 extend between respective pairs of oppositely facing openings which define each of the holes. In accordance with one aspect of this embodiment, a masking layer 252 is formed over the carrier 112 and in particular over the top and bottom surfaces 114, 116. A conductivity enhancing impurity is then provided into the silicon carrier and received by and within internal wall portions or surfaces 219, 221, 223 to form diffusion regions 254. Such outer sheaths 250 can also be provided or formed through the inherent doping concentration of the illustrated silicon carrier, or by other carrier doping, prior to formation of the illustrated holes.

In accordance with this aspect of the invention, the outer sheaths 250 are respective outer coaxial line conductive components comprising semiconductive material which is doped with a suitable conductivity enhancing impurity. Accordingly, diffusion regions 254 are a first conductive material which is formed at least at a portion of and preferably at all of the interior surfaces or wall portions 219, 221, 223.

Figure 15:
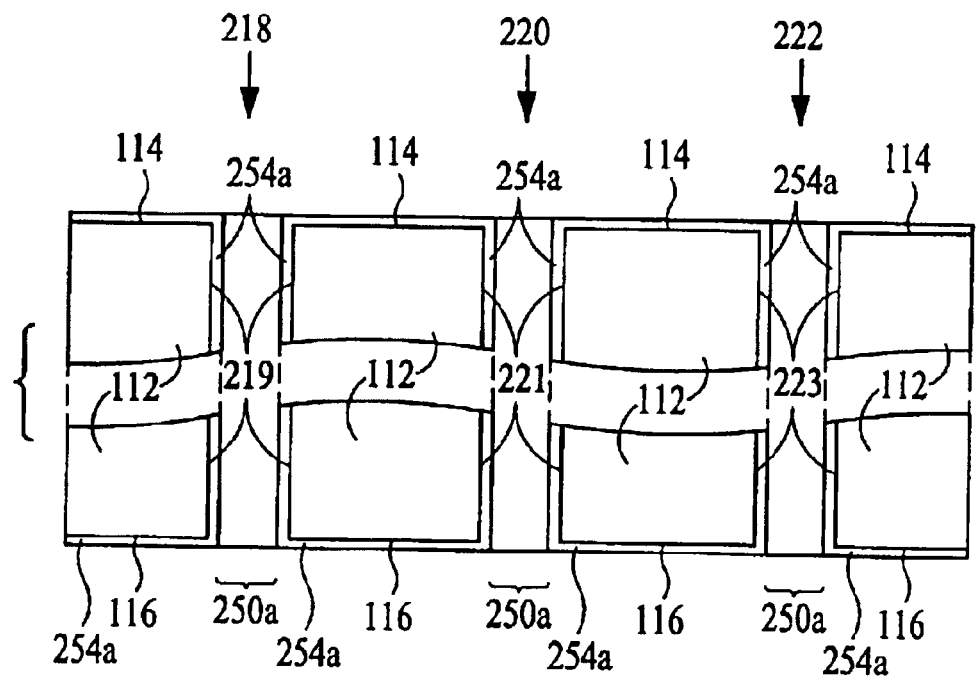
FIG. 15 is an alternate embodiment of the carrier shown in FIG. 11 with a metal-comprising material over the carrier and in the holes or passageways.

An alternate embodiment is shown in FIG. 15. Like numbers from the FIG. 14 construction are utilized where appropriate with differences being indicated by the suffix "a"

or with different numbers. In this embodiment, outer conductive sheaths 250a are formed within holes or passageways 218, 220, and 222 and over respective interior wall portions 219, 221, and 223. Sheaths 250a are preferably formed by depositing a layer 254a of a metal-comprising material over the carrier 112, within the holes and over the respective wall portions 219, 221, 223 thereof. Any suitable method of providing such metal-comprising layer can be utilized. One method includes a low-pressure chemical vapor deposition (LPCVD) of tungsten in a self-limiting process which provides a tungsten film by silicon reduction. Accordingly, silicon material within holes 218, 220, 222 is replaced by tungsten atoms in a $WF_6$ reaction gas, with a reaction product $SiF_4$ being pumped out or otherwise removed from the deposition chamber. This step can be followed by silane or polysilane reduction of the $WF_6$ until a desired thickness is reached. Deposition rates in accordance with the above are dependent upon the temperature and the reaction gas flow rate. Excellent deposition rates have been observed at 1 micron per minute, at temperatures of 300° C. and with a flow rate of $WF_6$ at 4 sccm in a cold wall CVD reactor.

Figure 16:
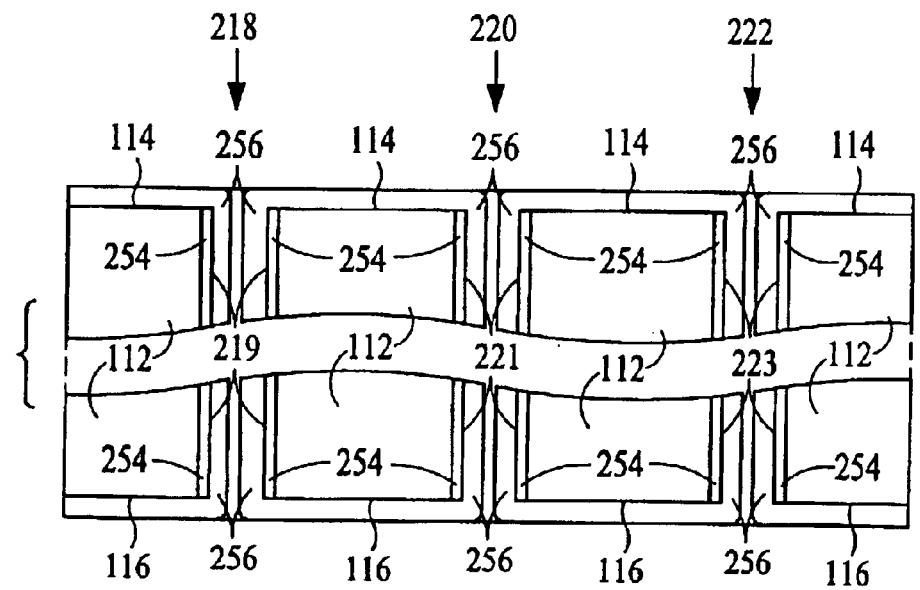
FIG. 16 shows the carrier of FIG. 14 with a dielectric material formed over the carrier and within the holes or passageways.

Referring to FIG. 16, a dielectric material layer 256 is formed over the carrier 112 and within holes 218, 220, and 222 to form a portion of the layer 256 radially inwardly of interior wall portions 219, 221, and 223 and diffusion regions 254. Alternatively, and with reference to the FIG. 15 construction, layer 256 can be formed radially inwardly of and over conductive material forming layer 254a. The dielectric material layer 256 which is disposed in holes 218, 220, and 222 provides a dielectric material over and radially inwardly of the outer conductive is sheath. A suitable dielectric material is $SiO_2$.

Alternately, the layer 256 can comprise a composite of layers. For example, one portion of the dielectric layer 256 can comprise a nitride containing layer which is disposed proximate interior wall portions 219, 221, and 223. An oxide-containing layer is formed over the nitride-containing layer to provide a dielectric NO layer 256 within the hole. In a preferred embodiment, the nitride layer is formed by chemical vapor deposition, and the oxide layer is formed by exposing the carrier to oxidizing conditions. Specifically., in the preferred embodiment, dielectric layers 256 constitute a reoxidized LPCVD nitride film which forms the preferred NO dielectric layer. Suitable processing parameters include in-situ nitridation in ammonia at 950° C.

Low pressure chemical vapor deposition of nitride at 700° C. takes place with dichlorosilane and ammonia until about two-thirds of the hole diameter is filled (not shown to scale). Subsequently, reoxidation of the nitride takes place at a temperature of between 900° C. to 950° C. Alternatively, fast thermal processing (FTP) can implement the above-described processing steps in a single processing run. Suitable processing systems and methods are described in an article entitled "Trench Storage Node Technology for Gigabit DRAM Generations," Technical Digest of International Electron Devices Meeting, Dec. 8–11, 1996, pps. 507–510, published by IEEE, Catalog No. 96CH35961 by Muller et al, which publication is incorporated herein by reference.

Figure 17:
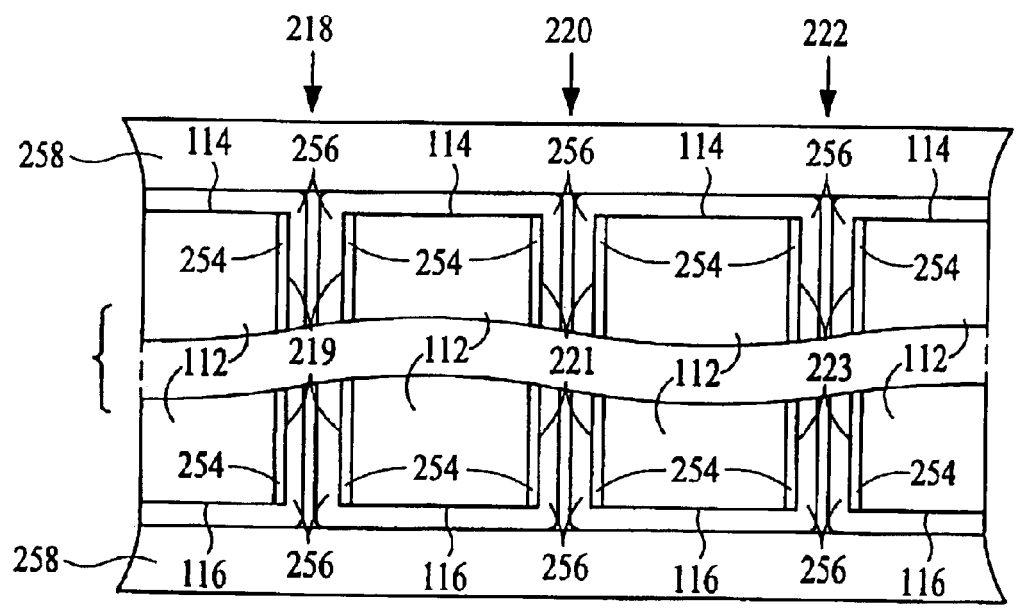
FIG. 17 shows the carrier of FIG. 16 with a material such as polysilicon formed over the carrier and within each hole or passageway.

Referring to FIG. 17, a first layer of material 258 is formed over the carrier and within each hole 218, 220, and 222. In a preferred aspect, such first material is polysilicon which is formed through suitable chemical vapor deposition techniques. Thus, such first material is formed over and radially inwardly of dielectric material layer 256 within holes 218, 220, and 222.

Figure 18:
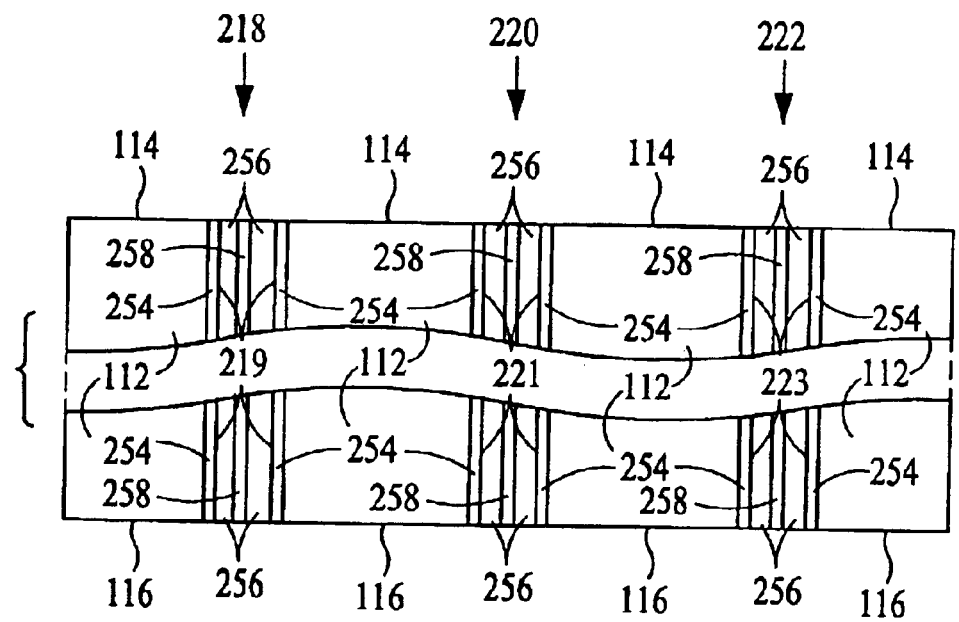
FIG. 18 shows the carrier of FIG. 17 with the top and bottom surfaces planarized.

Referring to FIG. 18, the first material 258 is planarized relative to carrier 212 and isolated within holes 218, 220, and 222. Planarizing techniques include abrasion of the carrier as by chemical mechanical polishing (CMP).

Figure 19:
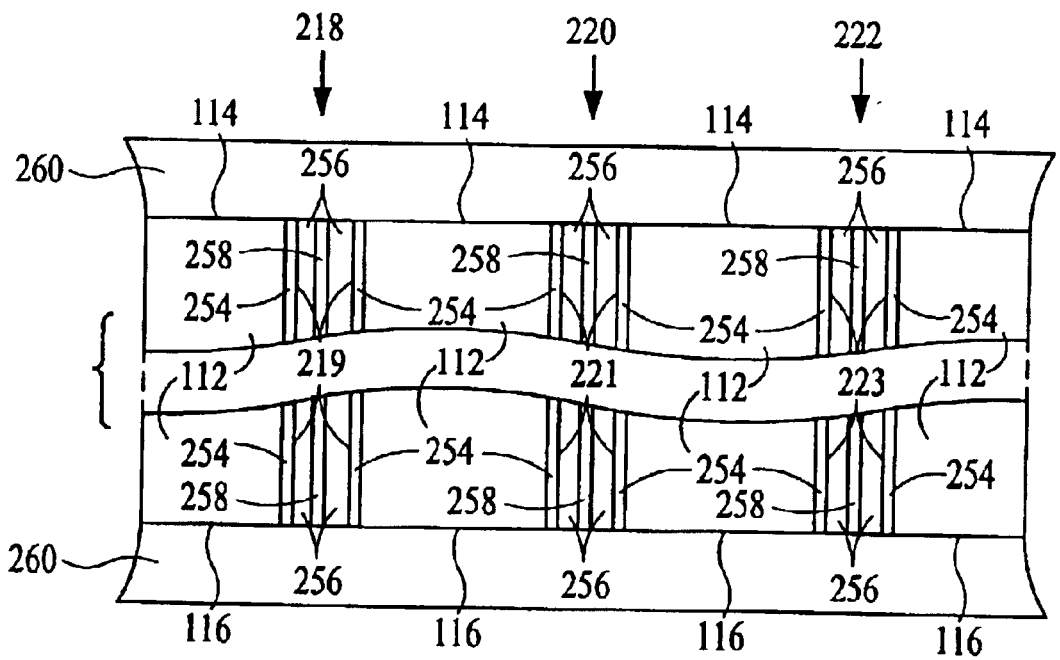
FIG. 19 shows the carrier of FIG. 18 with a metallic material over the polysilicon layer.

Referring to FIG. 19, a second layer of material 260 is formed over the silicon carrier 112 and first material 258. In one aspect, the second material 260 is a layer comprising a metal material which is different from first material 258. Preferably, the second material 260 is an aluminum-comprising layer of film which is formed over the first material 258. Such material or film can be deposited by suitable sputtering or evaporation techniques. Mechanical masks can be used to define the area over which the preferred aluminum-containing layer of film is deposited. Alternatively, such layer can be blanket deposited and subsequently processed as described in the following paragraph. The second material 260 is preferably deposited over the top and bottom surfaces 214, 216.

Figure 20:
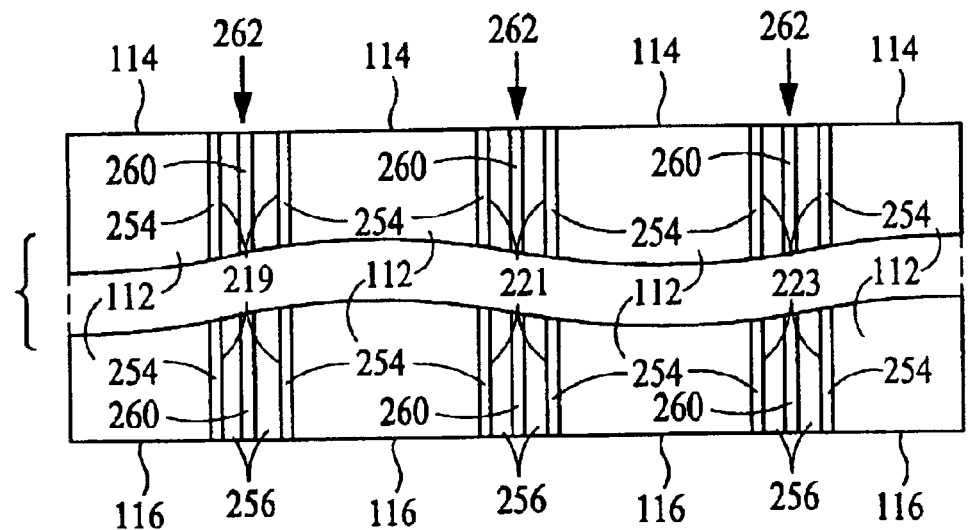
FIG. 20 shows the carrier of FIG. 19 following a processing step causing the metallic material to replace the polysilicon.

Referring to FIG. 20, the silicon carrier 112 is exposed to processing conditions which are effective to cause the second material 260 to replace first material 258 (FIG. 19). An example includes annealing at 500° C. or greater. The thickness of the second material 260 will be determined by the size and dimensions of the interconnecting hole or passageway. For example a 0.175 micron diameter and 1.7 micron deep hole with an aspect ratio of 10, and aluminum thickness of 0.5 microns is sufficient to substitute the preferred polysilicon. Subsequently, any excess aluminum and the substituted polysilicon can be removed through suitable processing techniques such as chemical mechanical polishing. Thus, the silicon carrier 112 material is replaced by conductible material to form a conductive core within the carrier over and radially inwardly of the dielectric material layer 256. Examples of processing methods are described in an article entitled "Novel High Aspect Ratio Plug for Logic/DRAM LSIs Using Polysilicon-Aluminum Substitute (PAS)," Technical Digest of International Electron Devices Meeting, Dec. 8–11, 1996, pps. 946–8, published by IEEE, Catalog No. 96CH35961 by Horie et al, which publication is incorporated herein by reference.

The processing methods described above form a coaxial integrated circuitry interconnect line. In a preferred aspect of the invention, the coaxial integrated circuitry interconnect line extends entirely through the silicon carrier 112, as shown at 262. Exemplary coaxial interconnect lines include an outer conductive coaxial line component having a first thickness next to the semiconductive carrier. An inner conductive coaxial line component has a second thickness. Coaxial dielectric material, such as that described above, is disposed between the inner and outer conductive coaxial line components. In a preferred embodiment, the dielectric material has a substantially uniform third thickness which is greater than at least one of the first and second thicknesses.

Figure 21:
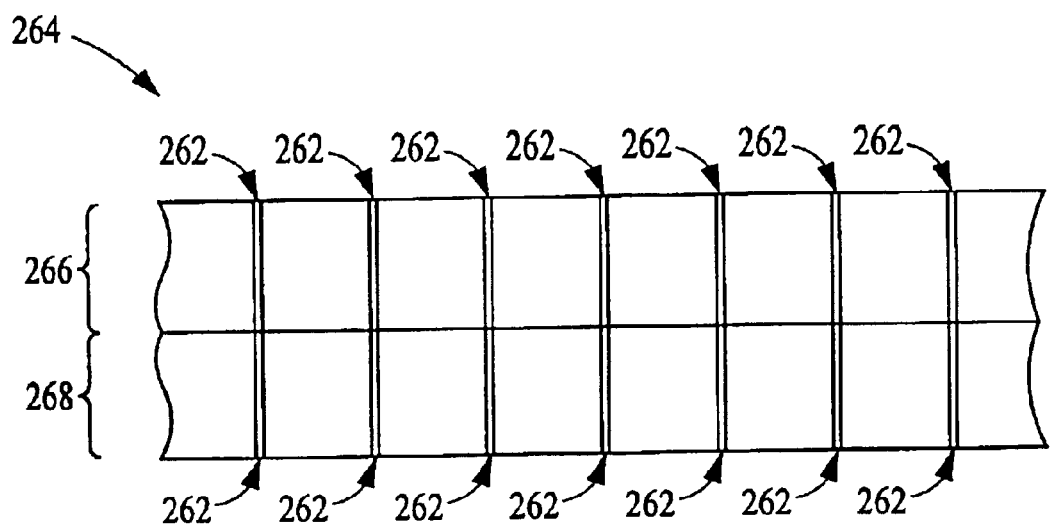
FIG. 21 shows another embodiment of the present invention wherein a plurality of carriers are stacked.

The above described method provides coaxial lines formed through the carrier to interconnect integrated components on the top and the bottom of the carrier. One advantage of this is that the carriers can be stacked on top of one another, and signals can be interchanged therebetween without having to separately package the die and mount the same on printed circuit boards. An example of this configuration 264 is shown in FIG. 21 where a first carrier 266, preferably a silicon carrier, functions as a first IC supporting substrate. A second carrier 268, preferably a silicon carrier, functions as a second IC supporting substrate. Each carrier 266, 268 is provided with a plurality of holes or passageways which extend through at least one, and preferably both of such carriers. The illustrated holes are provided with appropriate coaxial interconnect lines 262 formed in accordance with the instant invention. Intervening deformable conductive material can be provided between the carriers to facilitate a physical and electrical connection between the carriers and the coaxial lines formed therein. Although only two carriers are shown, it will be understood that many carriers could be similarly configured and stacked.

Considerable potential savings are realized by not separately packing all individual silicon die or chips, required for a system, such as the RF telephone handsets described above and illustrated in FIGS. 1 to 3, and mounting them on printed circuit boards. Instead, these dies or chips can be mounted in or as a chip on a carrier constructed in accordance with the invention or one on top of the other, and a large of number of channels for interconnection of signals can be made available by the coaxial interconnect line through each individual carrier.

Certain areas of the carrier may be dedicated to high-performance passive components. The invention contemplates optionally introducing air-bridge type inductors of high Q and transformers.

Figure 22:
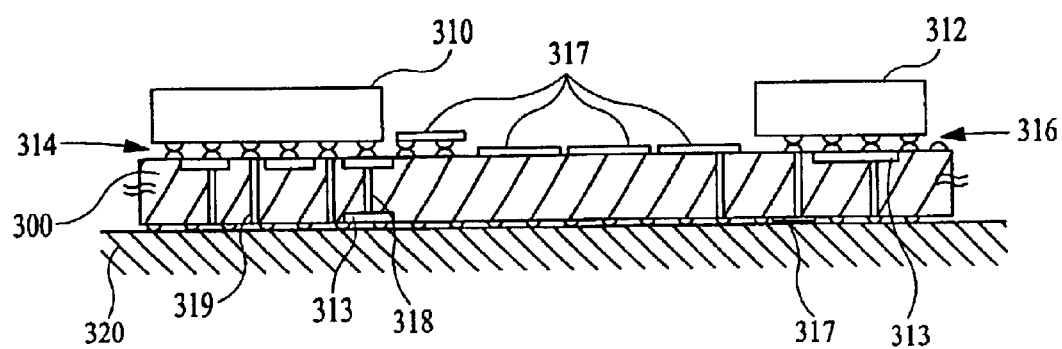
FIG. 22 is a side schematic view of a carrier with integrated circuits mounted thereon.

With reference to FIG. 22, there is shown a carrier 300 with active chips 310, 312 mounted thereon by miniature solder balls 314, 316. The chip 310 is an integrated circuit containing portions of a communications system, and the chip 312 is a GaAs integrated circuit containing other portions of the communications system. A plurality of passive components 317 are fabricated directly on the carrier 300 or on a substrate connected to the carrier through solder balls 314. Other components 313 are formed in the carrier 300. A plurality of passageways 318 have conductive material formed therein in accordance with aspects of the present invention to interconnect the active and passive integrated circuit components on the top and bottom surfaces of the carrier 300. The bottom surface of carrier 300 is populated with mini-ball grid arrays 319 to be used for attaching the carrier 300 onto a substrate, a mother board or a system board 320.

It is to be understood that the figures have been simplified to illustrate only those aspects of semiconductor topography which are relevant, and some of the dimensions have been exaggerated to convey a clear understanding of the present invention, while eliminating, for the purposes of clarity, some elements normally found on or in a semiconductor structure. Those of ordinary skill in the art will recognize that other elements and process steps are required to produce an operational semiconductor. However, because such elements and process steps are well known in the art, and because they do not further aid in the understanding of the present invention, a discussion of such elements is not provided herein.

Although the present invention has been described with preferred embodiments, it is to be understood that modifications and variations may be utilized without departing from the spirit and scope of this invention, as those skilled in the art will readily understand. Such modifications and variations are considered to be part of the invention, provided they come within the scope of the appended claims and their equivalents.

What is claimed is:

1. A communications system, comprising:
   a carrier having a first side and a second side, said first side being electrically integrated with said second side by at least one conductive passageway forming a coaxial interconnect through said carrier;
   a GaAs chip on one of said first and second sides of said carrier; and
   at least one second chip on one of said first and second sides of said carrier, wherein said GaAs chip and said at least one second chip are electrically interconnected by circuit components of said carrier.

2. The communications system of claim 1, wherein said at least one second chip is a silicon chip.

3. The communications system of claim 1, wherein said carrier comprises silicon.

4. The communications system of claim 1, wherein said GaAs chip and said at least one second chip are both on said first side of said carrier.

5. The communications system of claim 4, wherein said carrier is connected with a board at said second side.

6. The communications system of claim 1, wherein said GaAs chip is a microwave chip and said at least one second chip is a radio frequency chip.

7. The communications system of claim 1, further comprising a plurality of other electrical components on said first and second sides of said carrier.

8. The communications system of claim 1, further comprising a plurality of said conductive passageways.

9. The communications system of claim 1, wherein said system is a portion of a wireless voice and data system.

10. The communications system of claim 1, wherein said system is a multi-layer TAB tape assembly.

11. A wireless communication device, comprising:
    a carrier having a first surface and a second surface opposite said first surface;
    a plurality of integrated circuit components on said first and second surfaces of said carrier and electrically interconnected by at least one conductive passageway forming a coaxial interconnect line through said carrier;
    a microwave chip mounted on one of the first and second surfaces of said carrier; and
    a radio frequency chip mounted on one of the first and second surfaces of said carrier.

12. The wireless communication device of claim 11, wherein one of said microwave chip and said radio frequency chip is GaAs and the other is Si.

13. The wireless communication device of claim 11, wherein said carrier comprises silicon.

14. The wireless communication device of claim 11, wherein said carrier is mounted on a circuit board.

15. The wireless communication device of claim 11, further comprising a plurality of said conductive passageways.

16. The wireless communication device of claim 11, wherein said microwave chip and said radio frequency chip are electrically interconnected to a circuit board through said at least one conductive passageway, said carrier being between the microwave and said radio frequency chips and said circuit board.

17. The wireless communication device of claim 11, wherein said microwave chip and said radio frequency chip are both on the same first or second surface of said carrier.

18. A communications system, comprising:
    a carrier having a first side and a second side, said first side being electrically integrated with said second side by at least one conductive passageway through said carrier;
    a GaAs microwave chip on one of said first and second sides of said carrier; and
    at least one second radio frequency chip on one of said first and second sides of said carrier, wherein said GaAs microwave chip and said at least one second radio frequency chip are electrically interconnected by circuit components of said carrier.

19. The communications system of claim 18, wherein said GaAs microwave chip and said at least one second radio frequency chip are on said first side of said carrier.

20. The communications system of claim 18, wherein said GaAs microwave chip is on said first side of said carrier and said at least one second radio frequency chip is on said second side of said carrier.

21. The communications system of claim 18, wherein said system is a portion of a wireless voice and data system.

22. The communications system of claim 18, wherein said system is a multi-layer TAB tape assembly.

23. The communications system of claim 18, wherein said carrier is mounted on a circuit board.

* * * * *